(12) United States Patent
Carroll et al.

(10) Patent No.: US 10,069,020 B2
(45) Date of Patent: *Sep. 4, 2018

(54) THICK-FILM PASTES CONTAINING LEAD- AND TELLURIUM-OXIDES, AND THEIR USE IN THE MANUFACTURE OF SEMICONDUCTOR DEVICES

(71) Applicant: E I DU PONT DE NEMOURS AND COMPANY, Wilmington, DE (US)

(72) Inventors: Alan Frederick Carroll, Raleigh, NC (US); Kenneth Warren Hang, Cary, NC (US); Brian J. Laughlin, Apex, NC (US); Kurt Richard Mikeska, Hockessin, DE (US); Carmine Torardi, Wilmington, DE (US); Paul Douglas Vernooy, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 947 days.

This patent is subject to a terminal disclaimer.

(21) Appl. No.: 13/800,592

(22) Filed: Mar. 13, 2013

(65) Prior Publication Data

US 2013/0255767 A1 Oct. 3, 2013

Related U.S. Application Data

(63) Continuation of application No. 13/100,533, filed on May 4, 2011, now Pat. No. 8,497,420.
(Continued)

(51) Int. Cl.
*H01L 31/00* (2006.01)
*H01L 21/44* (2006.01)
(Continued)

(52) U.S. Cl.
CPC ...... *H01L 31/022425* (2013.01); *B22F 1/007* (2013.01); *B22F 1/0059* (2013.01);
(Continued)

(58) Field of Classification Search
CPC ..... H01L 2224/056; H01L 2224/05616; H01L 31/022425; H01L 31/0264; H01L 31/1884;
(Continued)

(56) References Cited

U.S. PATENT DOCUMENTS 4,293,451 A 10/1981 Ross
4,643,913 A 2/1987 Okunaka et al.
(Continued)

FOREIGN PATENT DOCUMENTS

CN 1060280 A 4/1992
CN 1873836 A 12/2006
(Continued)

OTHER PUBLICATIONS

Zhang, Y. et al., "Effect of the Interface Glass on Electrical Performance of Screen Printed Ag Thick-Film Contacts of Si Solar Cells", Thin Solid Films, vol. 518(24), 2010, E111-E113.
(Continued)

*Primary Examiner* — Jeffrey T Barton
*Assistant Examiner* — Andrew J Golden (57) ABSTRACT

The present invention provides a thick-film paste for printing the front-side of a solar cell device having one or more insulating layers. The thick-film paste comprises an electrically conductive metal, and a lead-tellurium-oxide dispersed in an organic medium.

16 Claims, 1 Drawing Sheet

Related U.S. Application Data (60) Provisional application No. 61/331,006, filed on May 4, 2010, provisional application No. 61/440,117, filed on Feb. 7, 2011, provisional application No. 61/445,508, filed on Feb. 22, 2011, provisional application No. 61/467,003, filed on Mar. 24, 2011.

(51) Int. Cl.

| | | |
|---|---|---|
| *H01B 1/02* | (2006.01) | |
| *H01B 1/22* | (2006.01) | |
| *H01L 31/0224* | (2006.01) | |
| *B22F 1/00* | (2006.01) | |
| *B22F 7/04* | (2006.01) | |
| *B22F 7/08* | (2006.01) | |
| *C03C 8/10* | (2006.01) | |
| *C03C 8/12* | (2006.01) | |
| *C04B 35/01* | (2006.01) | |
| *H01B 1/16* | (2006.01) | |
| *H01L 31/18* | (2006.01) | |
| *H01L 31/0264* | (2006.01) | |

(52) U.S. Cl.
CPC .............. *B22F 7/04* (2013.01); *B22F 7/08* (2013.01); *C03C 8/10* (2013.01); *C03C 8/12* (2013.01); *C04B 35/01* (2013.01); *H01B 1/16* (2013.01); *H01B 1/22* (2013.01); *H01L 31/0264* (2013.01); *H01L 31/1884* (2013.01); *B22F 2007/047* (2013.01); *H01L 2924/0002* (2013.01); *Y02E 10/50* (2013.01); *Y02E 10/52* (2013.01)

(58) Field of Classification Search
CPC ......... C03C 3/122; C03C 3/125; C03C 3/127; C03C 3/142; C03C 8/18; C03C 8/10; C03C 8/12; B22F 1/007
USPC ..................... 136/243–265; 252/500, 502
See application file for complete search history.

(56) References Cited

U.S. PATENT DOCUMENTS

| | | | |
|---|---|---|---|
| 4,945,071 A | 7/1990 | Friesen et al. | |
| 5,013,697 A | 5/1991 | Akhtar | |
| 5,066,621 A | 11/1991 | Akhtar | |
| 5,118,362 A | 6/1992 | St. Angelo et al. | |
| 5,188,990 A | 2/1993 | Dumesnil et al. | |
| 5,240,884 A | 8/1993 | Herrington et al. | |
| 5,245,492 A | 9/1993 | Mizuno et al. | |
| 5,334,558 A | 8/1994 | Dietz et al. | |
| 5,336,644 A | 8/1994 | Akhtar et al. | |
| 5,594,406 A * | 1/1997 | Koyama | H01C 7/112 252/519.5 |
| 5,616,173 A | 4/1997 | Okamoto et al. | |
| 5,663,109 A | 9/1997 | Dietz et al. | |
| 6,204,443 B1 | 3/2001 | Kiso et al. | |
| 7,494,607 B2 | 2/2009 | Wang et al. | |
| 7,537,713 B2 | 5/2009 | Satou et al. | |
| 7,736,546 B2 | 6/2010 | Prunchak | |
| 7,871,949 B2 | 1/2011 | Lee et al. | |
| 7,910,393 B2 | 3/2011 | Kim et al. | |
| 8,313,673 B2 | 11/2012 | Wang et al. | |
| 8,383,017 B2 | 2/2013 | Carroll et al. | |
| 8,470,723 B2 | 6/2013 | Naito et al. | |
| 8,497,420 B2 | 7/2013 | Carroll et al. | |
| 8,512,463 B2 | 8/2013 | Hang | |
| 8,546,281 B2 | 10/2013 | Lee et al. | |
| 8,696,948 B2 | 4/2014 | Hang et al. | |
| 8,771,554 B2 | 7/2014 | Rajendran | |
| 8,889,041 B2 | 11/2014 | Sridharan et al. | |
| 8,889,979 B2 | 11/2014 | Carroll et al. | |
| 8,889,980 B2 | 11/2014 | Carroll et al. | |
| 8,895,843 B2 | 11/2014 | Carroll et al. | |
| 9,722,100 B2 | 8/2017 | Carroll et al. | |
| 2006/0102228 A1 | 5/2006 | Sridharan et al. | |
| 2006/0231800 A1 | 10/2006 | Wang et al. | |
| 2006/0231803 A1 | 10/2006 | Wang et al. | |
| 2006/0231804 A1 | 10/2006 | Wang et al. | |
| 2006/0272700 A1 | 12/2006 | Young et al. | |
| 2008/0223446 A1 | 9/2008 | Wang et al. | |
| 2009/0095344 A1 | 4/2009 | Machida et al. | |
| 2009/0189126 A1 | 7/2009 | Prunchak | |
| 2009/0199897 A1 | 8/2009 | Naito et al. | |
| 2009/0255584 A1 | 10/2009 | Carroll | |
| 2009/0298283 A1 | 12/2009 | Akimoto et al. | |
| 2010/0135849 A1 | 6/2010 | Gu et al. | |
| 2010/0163101 A1 | 7/2010 | Kumar et al. | |
| 2010/0180934 A1 | 7/2010 | Naito et al. | |
| 2010/0275987 A1 | 11/2010 | Sakamoto et al. | |
| 2011/0094578 A1 | 4/2011 | Akimoto et al. | |
| 2011/0095240 A1 | 4/2011 | Nakamura et al. | |
| 2011/0192457 A1 | 8/2011 | Nakayama et al. | |
| 2011/0232746 A1 | 9/2011 | Carroll et al. | |
| 2011/0232747 A1 | 9/2011 | Mikeska et al. | |
| 2011/0308595 A1 | 12/2011 | Carroll et al. | |
| 2011/0308596 A1 | 12/2011 | Carroll et al. | |
| 2011/0308597 A1 | 12/2011 | Carroll et al. | |
| 2011/0315937 A1 | 12/2011 | Aoyagi et al. | |
| 2013/0049148 A1 | 2/2013 | Hang et al. | |
| 2013/0099177 A1 | 4/2013 | Rajendran | |
| 2013/0099178 A1 | 4/2013 | Hang et al. | |
| 2013/0186463 A1 | 7/2013 | Wang et al. | |
| 2013/0255767 A1 | 10/2013 | Carroll et al. | |
| 2013/0255768 A1 | 10/2013 | Carroll et al. | |
| 2013/0255769 A1 | 10/2013 | Carroll et al. | |
| 2013/0255770 A1 | 10/2013 | Carroll et al. | |
| 2013/0298982 A1 | 11/2013 | Hang et al. | |

FOREIGN PATENT DOCUMENTS

| | | |
|---|---|---|
| CN | 101055896 A | 10/2007 |
| CN | 101164934 A | 4/2008 |
| CN | 107424662 A | 12/2017 |
| EP | 0430206 A1 | 6/1991 |
| EP | 0463826 A1 | 1/1992 |
| EP | 0466295 A1 | 1/1992 |
| EP | 0537886 A1 | 4/1993 |
| EP | 0393416 B1 | 6/1993 |
| EP | 1713091 B1 | 9/2010 |
| JP | 59033869 A | 2/1984 |
| JP | 62-036040 | 2/1987 |
| JP | 01-138150 | 5/1989 |
| JP | 02-293344 | 4/1990 |
| JP | 03-218943 | 9/1991 |
| JP | 04-224178 | 8/1992 |
| JP | 04-270140 | 9/1992 |
| JP | 05-105484 | 4/1993 |
| JP | 05-175254 A | 7/1993 |
| JP | 5-175254 A | 7/1993 |
| JP | 08-097011 | 4/1996 |
| JP | 08-138438 | 5/1996 |
| JP | 09-092027 | 4/1997 |
| JP | 10-340621 | 12/1998 |
| JP | 10340621 A | 12/1998 |
| JP | 2011118425 A | 4/2001 |
| JP | 2001284754 A | 10/2001 |
| JP | 2006-093433 | 4/2006 |
| JP | 2006-302890 | 11/2006 |
| JP | 2006-302891 A | 11/2006 |
| JP | 2008-520094 A | 6/2008 |
| JP | 2009-099781 A | 5/2009 |
| JP | 2009-99781 A | 5/2009 |
| JP | 2010-238955 A | 10/2010 |
| JP | 2010-251645 | 11/2010 |
| JP | 2010-283340 | 12/2010 |
| JP | 2011-018425 A | 1/2011 |
| KR | 10-1990-0016060 A | 11/1990 |
| KR | 10-2006-0108547 A | 10/2006 |
| KR | 10-2008-0022088 A | 3/2008 |
| WO | 92/00924 A1 | 1/1992 |
| WO | 9200925 A1 | 1/1992 |
| WO | 2006/132766 A2 | 12/2006 |

(56) References Cited

FOREIGN PATENT DOCUMENTS

| WO | 2008134417 A1 | 11/2008 |
|---|---|---|
| WO | 2009/052356 A2 | 4/2009 |
| WO | 2010123967 A2 | 10/2010 |
| WO | 2012099877 A1 | 7/2012 |
| WO | 2012116052 A1 | 8/2012 |

OTHER PUBLICATIONS

International Search Report, US Commissioner for Patents, Alexandria, Virginia, in PCT/US2011/035154, PCT Counterpart of the U.S. Appl. No. 13/100,533.
U.S. Appl. No. 13/100,533, filed May 4, 2011, Carroll et al.
U.S. Appl. No. 13/100,540, filed May 4, 2011, Carroll et al.
U.S. Appl. No. 13/801,036, filed Mar. 13, 2013, Carroll et al.
U.S. Appl. No. 13/100,550, filed May 4, 2011, Carroll et al.
U.S. Appl. No. 13/800,861, filed Mar. 13, 2013, Carroll et al.
U.S. Appl. No. 13/100,563, filed May 4, 2011, Carroll et al.
U.S. Appl. No. 13/801,248, filed Mar. 13, 2013, Carroll et al.
Zhang, Y. et al., "Thermal Properties of Glass Frit and Effects on Si Solar Cells", Materials Chemistry and Physics, vol. 114 (1), 2009, 319-322.
International Search Report, US Commissioner for Patents, Alexandria, Virginia, in PCT/US2011/035131, PCT Counterpart of the Present U.S. Appl. No. 13/100,540.
International Search Report, US Commissioner for Patents, Alexandria, Virginia in PCT/US/2011/03519, PCT Counterpart of the Present U.S. Appl. No. 13/100,550.
International Search Report, US Commissioner for Patents, Alexandria, Virginia, in PCT/US2011/035145, PCT Counterpart of the Present U.S. Appl. No. 13/100,563.
International Search Report dated Aug. 3, 2012, International Application No. PCT/US2012/26085.
International Search Report dated Oct. 18, 2012, International Application No. PCT/US2012/030475.
International Search Report, US Commissioner for Patents, Alexandria, Virginia, in PCT/US2011/035167, PCT Counterpart of the Present U.S. Appl. No. 13/100,619.
International Search Report, US Commissioner for Patents, Alexandria, Virginia, in PCT/US2011/035139, PCT Counterpart of the Present U.S. Appl. No. 13/100,550.
Kurihara, Yasutoshi et al., "Ag—Pd Thick Film Conductor for AiN Ceramics", IEEE Transactions on Components, Hybrids, and Manufacturing Technology, vol. 13(2), 1990, 306-312.
Zhang, Y. et al., "Thermal Properties of Glass Frit and Effects on Si Solar Cells", Materials Chemist and Physics, vol. 114 (1), 2009, 319-322.
Non-Final Office Action dated May 14, 2013, in U.S. Appl. No. 13/401,191.
Non-Final Office Action dated Dec. 22, 2011, in U.S. Appl. No. 13/100,619.
Non-Final Office Action dated Jul. 19, 2012, in U.S. Appl. No. 13/100,619.
Final Office Action dated Mar. 28, 2013, in U.S. Appl. No. 13/100,619.
Non-Final Office Action dated May 10, 2012, in U.S. Appl. No. 13/100,540.
Final Office Action dated Mar. 14, 2013, in U.S. Appl. No. 13/100,540.
Non-Final Office Action dated Dec. 22, 2011, in U.S. Appl. No. 13/100,550.
Non-Final Office Action dated Sep. 6, 2012, in U.S. Appl. No. 13/100,550.
Final Office Action dated Mar. 1, 2013, in U.S. Appl. No. 13/100,540.
Non-Final Office Action dated May 11, 2012, in U.S. Appl. No. 13/100,563.
Final Office Action dated Mar. 1, 2013, in U.S. Appl. No. 13/100,563.
(JP Patent Application No. 2013-509214)—Information Offer Form.
(U.S. Appl. No. 13/100,543, filed May 4, 2011) Non-Final Office Action dated May 22, 2014.
(EP Patent Aplication No. 11731163.9)—Communication from EPO.
Application No. 201180032701.8—Office Action dated Aug. 4, 2014.
Application No. 201180031225.8—Office Action dated Aug. 5, 2014.
Application No. 201180032359.1—Office Action dated Aug. 19, 2014.
Application No. 201180031184.2—Office Action dated Aug. 20, 2014.
Journal of the Ceramic Association, Japan, 1968, vol. 76 (873), p. 160-172.
Rane, B. et al., "Firing and processing effects on microstructure of frilled silver thick film electrode materials for solar cells", Materials Chemistry and Physics, vol. 82, 2003, pp. 237-245.
Larry, J. R., et al., "Thick-Film Technology: An Introduction to the Materials", IEEE Transactions on Components, Hybrids, and Manufacturing Technology, vol. CHMT-3, No. 2, Jun. 1980.
Hilali, M., "Understanding and Development of Manufacturable Screen-Printed Contacts on High Sheet-Resistance Emitter for Low-Cost Silicon Solar Cells", A Thesis Presented to the Academic Faculty, Georgia Institute of Technology, Aug. 2005.

* cited by examiner

THICK-FILM PASTES CONTAINING LEAD- AND TELLURIUM-OXIDES, AND THEIR USE IN THE MANUFACTURE OF SEMICONDUCTOR DEVICES

FIELD OF THE INVENTION

The present invention provides a thick-film paste for printing the front-side of a solar cell device having one or more insulating layers. The thick film paste includes an electrically conductive metal, and a lead-tellurium-oxide dispersed in an organic medium.

TECHNICAL BACKGROUND

A conventional solar cell structure with a p-type base has a negative electrode that is typically on the front-side (sun-side) of the cell and a positive electrode on the back-side. Radiation of an appropriate wavelength falling on a p-n junction of a semiconductor body serves as a source of external energy to generate hole-electron pair charge carriers. These electron-hole pair charge carriers migrate in the electric field generated by the p-n semiconductor junction and are collected by a conductive grid or metal contact applied to the surface of the semiconductor. The current generated flows to the external circuit.

Conductive pastes (also termed inks) are typically used to form the conductive grids or metal contacts. Conductive pastes typically include a glass frit, a conductive species (e.g., silver particles), and an organic medium. To form the metal contacts, conductive pastes are printed onto a substrate as grid lines or other patterns and then fired, during which electrical contact is made between the grid lines and the semiconductor substrate.

However, crystalline silicon PV cells are typically coated with an anti-reflective coating such as silicon nitride, titanium oxide or silicon oxide to promote light adsorption, which increases the cell's efficiency. Such anti-reflective coatings also act as an insulator, which impairs the flow of electrons from the substrate to the metal contacts. To overcome this problem, the conductive ink should penetrate the anti-reflective coating during firing to form metal contacts having electrical contact with the semiconductor substrate. Formation of a strong bond between the metal contact and the substrate is also desirable.

The ability to penetrate the anti-reflective coating and form a strong bond with the substrate upon firing is highly dependent on the composition of the conductive ink and firing conditions. Efficiency, a key measure of PV cell performance, is also influenced by the quality of the electrical contact made between the fired conductive ink and the substrate.

To provide an economical process for manufacturing PV cells with good efficiency, there is a need for thick-film paste compositions that can be fired at low temperatures to penetrate an anti-reflective coating and provide good electrical contact with the semiconductor substrate.

SUMMARY

One aspect of the present invention is a thick-film paste composition including:
a) 85 to 99.5% by weight of an electrically conductive metal or derivative thereof, based on total solids in the composition;
b) 0.5 to 15% by weight based on solids of a lead-tellurium-oxide, wherein the mole ratio of lead to tellurium of the lead-tellurium-oxide is between 5/95 and 95/5; and
c) an organic medium.

Another aspect of the present invention is a process including;
(a) providing a semiconductor substrate including one or more insulating films deposited thereon;
(b) applying a thick-film paste composition onto the one or more insulating films to form a layered structure, wherein the thick-film paste composition includes:
   i) 85 to 99.5% by weight of an electrically conductive metal or derivative thereof, based on total solids in the composition;
   ii) 0.5 to 15% by weight based on solids of a lead-tellurium-oxide, wherein the mole ratio of lead to tellurium of the lead-tellurium-oxide is between 5/95 and 95/5; and
   iii) an organic medium; and
(c) firing the semiconductor substrate, one or more insulating films, and thick-film paste, forming an electrode in contact with the one or more insulating layers and in electrical contact with the semiconductor substrate.

Another aspect of this invention is an article including:
a) a semiconductor substrate;
b) one or more insulating layers on the semiconductor substrate; and
c) an electrode in contact with the one or more insulating layers and in electrical contact with the semiconductor substrate, the electrode including an electrically conductive metal and lead-tellurium-oxide.

BRIEF DESCRIPTION OF THE DRAWINGS

FIG. 1 is a process flow diagram illustrating the fabrication of a semiconductor device. Reference numerals shown in FIG. 1 are explained below.
10: p-type silicon substrate
20: n-type diffusion layer
30: insulating film
40: p+ layer (back surface field, BSF)
60: aluminum paste deposited on back-side
61: aluminum back electrode (obtained by firing back-side aluminum paste)
70: silver or silver/aluminum paste deposited on back-side
71: silver or silver/aluminum back electrode (obtained by firing back-side silver paste)
500: thick-film paste deposited on front-side
501: front electrode (formed by firing the thick-paste)

In FIG. 1(b), an n-type diffusion layer 20 of the reverse polarity is formed to create a p-n junction. The n-type diffusion layer 20 can be formed by thermal diffusion of phosphorus (P) using phosphorus oxychloride (POCl$_3$) as the phosphorus source. In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 microns. The n-type diffusion layer may have a sheet resistivity of several tens of ohms per square.

After protecting one surface of the n-type diffusion layer 20 with a resist or the like, as shown in FIG. 1(c), the n-type diffusion layer 20 is removed from most surfaces by etching so that it remains only on one main surface. The resist is then removed using an organic solvent or the like.

Next, in FIG. 1(d), an insulating layer 30 which also functions as an antireflection coating is formed on the n-type diffusion layer 20. The insulating layer is commonly silicon nitride, but can also be a SiN$_x$:H film (i.e., the insulating film includes hydrogen for passivation during subsequent firing processing), a titanium oxide film, or a silicon oxide film. A thickness of about 700 to 900 Å of a silicon nitride film is suitable for a refractive index of about 1.9 to 2.0. Deposition of the insulating layer 30 can be by sputtering, chemical vapor deposition or other methods.

Next, electrodes are formed. As shown in FIG. 1(e), a thick-film paste composition of this invention is screen-printed on the insulating film 30, and then dried. In addition, aluminum paste 60 and back-side silver paste 70 are screen-printed onto the back-side of the substrate, and successively dried. Firing is carried out at a temperature of 750 to 850° C. for a period of from several seconds to several tens of minutes.

Consequently, as shown in FIG. 1(f), during firing, aluminum diffuses from the aluminum paste into the silicon substrate on the back-side, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. At the same time, because soldering to an aluminum electrode is impossible, the silver or silver/aluminum back electrode is formed on limited areas of the backside as an electrode for interconnecting solar cells by means of copper ribbon or the like.

On the front-side, the thick-film paste composition 500 of the present invention sinters and penetrates through the insulating film 30 during firing, and thereby achieves electrical contact with the n-type diffusion layer 20. This type of process is generally called "fire through." This fired-through state, i.e., the extent to which the paste melts and passes through the insulating film 30, depends on the quality and thickness of the insulating film 30, the composition of the paste, and on the firing conditions. When fired, the paste 500 becomes the electrode 501, as shown in FIG. 1(f).

DETAILED DESCRIPTION

Solar-powered photovoltaic systems are considered to be environmentally friendly in that they reduce the need for fossil fuels.

The present invention provides compositions that can be used to manufacture photovoltaic devices with improved electrical performance.

The thick-film paste composition includes:
a) 85 to 99.5% by weight of an electrically conductive metal or derivative thereof, based on total solids in the composition;
b) 0.5 to 15% by weight based on solids of a lead-tellurium-oxide, wherein the mole ratio of lead to tellurium of the lead-tellurium-oxide is between 5/95 and 95/5; and
c) an organic medium.

As defined herein, the organic medium is not considered to be part of the solids including the thick-film paste composition.

Electrically Conductive Metal

The electrically conductive metal is selected from the group consisting of silver, copper and palladium. The electrically conductive metal can be in a flake form, a spherical form, a granular form, a crystalline form, a powder, or other irregular forms and mixtures thereof. The electrically conductive metal can be provided in a colloidal suspension.

When the metal is silver, t can be in the form of silver metal, silver derivatives, or mixtures thereof. Exemplary derivatives include: alloys of silver, silver oxide (Ag$_2$O), silver salts such as AgCl, AgNO$_3$, AgOOCCH$_3$ (silver acetate), AgOOCF$_3$ (silver trifluoroacetate), or silver orthophosphate, Ag$_3$PO$_4$, for example. Other forms of silver compatible with the other thick-film paste components can also be used.

In an embodiment, the weight ratio of elemental lead to elemental tellurium in the lead-tellurium-oxide is within the range of 0.87 to 9.51.

In one embodiment, the electrically conductive metal or derivatives thereof is from about 85 to about 99.5 wt % of the solid components of the thick-film paste composition. In a further embodiment, the electrically conductive metal or derivatives thereof is from about 90 to about 95 wt % of the solid components of the thick-film paste composition.

In an embodiment, the solids portion of the thick-film paste composition includes about 85 to about 99.5 wt % spherical silver particles. In one embodiment, the solids portion of the thick-film paste composition includes about 85 to about 90 wt % silver particles and about 1 to about 9.5 wt % silver flakes.

In one embodiment, the thick-film paste composition includes coated silver particles that are electrically conductive. Suitable coatings include phosphate and surfactants. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium and mixtures thereof.

The particle size of the silver is not subject to any particular limitation. In one embodiment, an average particle size is 0.5-10 microns; in another embodiment, the average particle size is 1-5 microns. As used herein, "particle size" or "D50" is intended to mean "average particle size"; "average particle size" means the 50% volume distribution size. Volume distribution size may be determined by LASER diffraction and dispersion method using a Microtrac particle size analyzer.

Lead-Tellurium-Oxide

The lead-tellurium-oxide (Pb—Te—O) can be prepared by mixing TeO$_2$ and lead oxide powders, heating the powder mixture in air or an oxygen-containing atmosphere to form a melt, quenching the melt, grinding and ball-milling the quenched material, and screening the milled material to provide a powder with the desired particle size. The lead oxide powders may include one or more component selected from the group consisting of: PbO, Pb$_3$O$_4$, and PbO$_2$. Firing the mixture of lead and tellurium oxides is typically conducted to a peak temperature of 800 to 1200° C. The molten mixture can be quenched, for example, on a stainless steel platen or between counter-rotating stainless steel rollers to form a thick platelet. The resulting platelet can be milled to form a powder. Typically, the milled powder has a D$_{50}$ of 0.1 to 3.0 microns. In an embodiment, the Pb—Te—O formed in this way may be at least partially crystalline.

Typically, the mixture of PbO and TeO$_2$, powders includes 5 to 95 mol % of lead oxide and 5 to 95 mole % of tellurium oxide, based on the combined powders. In one embodiment, the mixture of PbO and TeO$_2$ powders includes 30 to 85 mol % of lead oxide and 15 to 70 mol % of tellurium oxide, based on the combined powders. In another embodiment, the mixture of PbO and TeO$_2$ powders includes 30 to 65 mol % of lead oxide and 35 to 70 mol % of tellurium oxide, based on the combined powders.

In some embodiments, the mixture of PbO and TeO$_2$ powders further includes one or more other metal compounds. Suitable other metal compounds include TiO$_2$, Li$_2$O, B$_2$O$_3$, PbF$_2$, SiO$_2$, Na$_2$O, K$_2$O, Rb$_2$O, Cs$_2$O, Al$_2$O$_3$, MgO, CaO, SrO, BaO, V$_2$O$_5$, ZrO$_2$, MoO$_3$, Mn$_2$O$_3$, Ag$_2$O, ZnO, Ga$_2$O$_3$, GeO$_2$, In$_2$O$_3$, SnO$_2$, Sb$_2$O$_3$, Bi$_2$O$_3$, BiF$_3$, P$_2$O$_5$, CuO, MO, Cr$_2$O$_3$, Fe$_2$O$_3$, CoO, Co$_2$O$_3$, and CeO$_2$. Tables 1 and 2 list some examples of powder mixtures containing PbO, TeO$_2$ and other optional metal compounds that can be used to make lead-tellurium oxides. This list is meant to be illustrative, not limiting.

Therefore as used herein, the term "Pb—Te—O" may also include metal oxides that contain oxides of one or more elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Tel, V, Fe, Hf, Cr, Cd, Sb, Bi, F, Zr, Mn, P, Cu, Ce, and Nb.

Organic Medium

The inorganic components of the thick-film paste composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping and storage of the pastes, as well as on the printing screen during a screen-printing process.

Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives. The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also include volatile liquids to promote rapid hardening after application of the thick-film paste composition on a substrate.

The optimal amount of organic medium in the thick-film paste composition is dependent on the method of applying the paste and the specific organic medium used. Typically, the thick-film paste composition contains 70 to 95 wt % of inorganic components and 5 to 30 wt % of organic medium.

If the organic medium includes a polymer, the organic composition may include 8 to 15 wt % polymer.

Preparation of the Thick-Film Paste Composition

In one embodiment, the thick-film paste composition can be prepared by mixing the conductive metal powder, the Pb—Te—O powder, and the organic medium in any order. In some embodiments, the inorganic materials are mixed first, and they are then added to the organic medium. The viscosity can be adjusted, if needed, by the addition of solvents. Mixing methods that provide high shear may be useful.

Another aspect of the present invention is a process comprising:

a) providing a semiconductor substrate comprising one or more insulating films deposited onto at least one surface of the semiconductor substrate:

(b) applying a thick-film paste composition onto at least a portion of the one or more insulating films to form a layered structure, wherein the thick-film paste composition includes:
  i) 85 to 99.5% by weight of an electrically conductive metal or derivative thereof, based on total solids in the composition;
  ii) 0.5 to 15% by weight based on solids of a lead-tellurium-oxide, wherein the mole ratio of lead to tellurium of the lead-tellurium-oxide is between 5/95 and 95/5; and
  iii) an organic medium; and (c) firing the semiconductor substrate, one or more insulating films, and thick-film paste forming an electrode in contact with the one or more insulating layers and in electrical contact with the semiconductor substrate.

In one embodiment, a semiconductor device is manufactured from an article comprising a junction-bearing semiconductor substrate and a silicon nitride insulating film formed on a main surface thereof. The process includes the steps of applying (for example, coating or screen-printing) onto the insulating film, in a predetermined shape and thickness and at a predetermined position, a thick-film paste composition having the ability to penetrate the insulating layer, then firing so that thick-film paste composition reacts with the insulating film and penetrates the insulating film, thereby effecting electrical contact with the silicon substrate.

One embodiment of this process is illustrated in FIG. 1.

Figure 1A:
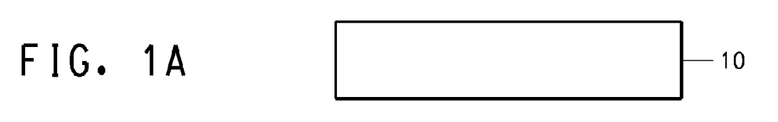
FIG. 1(a) shows a single-crystal silicon or multi-crystalline silicon p-type substrate 10.

FIG. 1(a) shows a single-crystal silicon or multi-crystalline silicon p-type substrate 10.

Figure 1B:
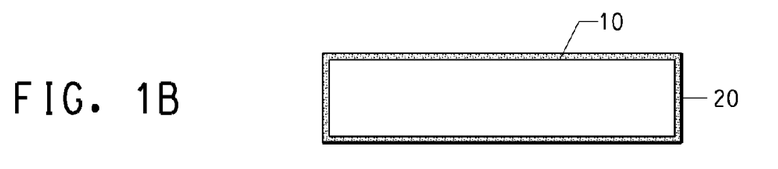
Figure 1C:
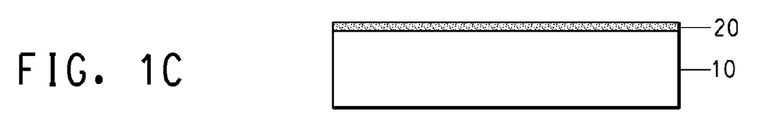

In FIG. 1(b), an n-type diffusion layer 20 of the reverse polarity is formed to create a p-n junction. The n-type diffusion layer 20 can be formed by thermal diffusion of phosphorus (P) using phosphorus oxychloride (POCl$_3$) as the phosphorus source. In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 microns. The n-type diffusion layer may have a sheet resistivity of several tens of ohms per square.

After protecting one surface of the n-type diffusion layer 20 with a resist or the like, as shown in FIG. 1 (c), the n-type diffusion layer 20 is removed from most surfaces by etching so that it remains only on one main surface. The resist is then removed using an organic solvent or the like.

Figure 1D:
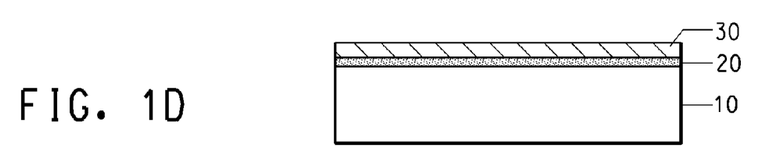

Next, in FIG. 1(d), an insulating layer 30 which also functions as an antireflection coating is formed on the n-type diffusion layer 20. The insulating layer is commonly silicon nitride, but can also be a SiN$_x$:H film (i.e., the insulating film includes hydrogen for passivation during subsequent firing processing), a titanium oxide film, or a silicon oxide film, A thickness of about 700 to 900 Å of a silicon nitride film is suitable for a refractive index of about 1.9 to 2.0. Deposition of the insulating layer 30 can be by sputtering, chemical vapor deposition or other methods.

Figure 1E:
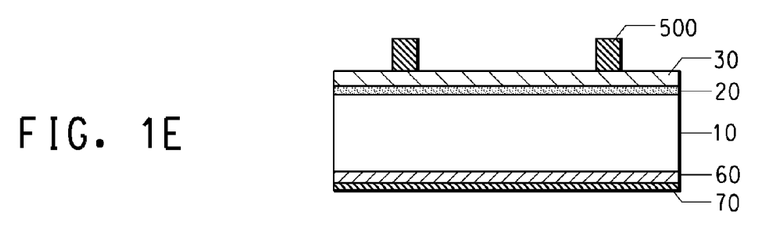

Next, electrodes are formed. As shown in FIG. 1(e), a thick-film paste composition of this invention is screen-printed on the insulating film 30, and then dried. In addition, aluminum paste 60 and back-side silver paste 70 are screen-printed onto the back-side of the substrate, and successively dried. Firing is carried out at a temperature of 750 to 850° C. for a period of from several seconds to several tens of minutes.

Figure 1F:
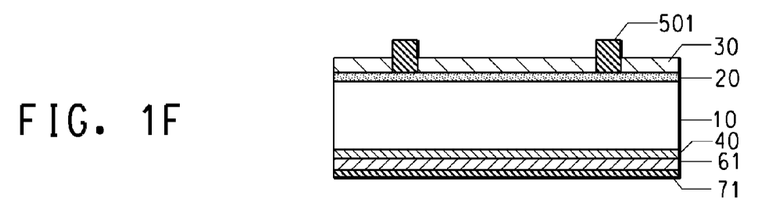

Consequently, as shown in FIG. 1(f), during firing, aluminum diffuses from the aluminum paste into the silicon substrate on the back-side, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. At the same time, because soldering to an aluminum electrode is impossible, the silver or silver/aluminum back electrode is formed on limited areas of the backside as an electrode for interconnecting solar cells by means of copper ribbon or the like.

On the front-side, the thick-film paste composition 500 of the present invention sinters and penetrates through the insulating film 30 during firing, and thereby achieves electrical contact with the n-type diffusion layer 20. This type of process is generally called "fire through." This fired-through state, i.e., the extent to which the paste melts and passes through the insulating film 30, depends on the quality and thickness of the insulating film 30, the composition of the paste, and on the firing conditions. When fired, the paste 500 becomes the electrode 501, as shown in FIG. 1(f).

In one embodiment, the insulating film is selected from titanium oxide, aluminum oxide, silicon nitride. $SiN_x$:H, silicon oxide, silicon carbon oxynitride, a silicon nitride film containing carbon, a silicon oxide film containing carbon and silicon oxide/titanium oxide films. The silicon nitride film can be formed by sputtering, a plasma enhanced chemical vapor deposition (PECVD), or a thermal CVD process. In one embodiment, the silicon oxide film is formed by thermal oxidation, sputtering, or thermal CFD or plasma CFD. The titanium oxide film can be formed by coating a titanium-containing organic liquid material onto the semiconductor substrate and firing, or by a thermal CVD.

In this process, the semiconductor substrate can be a single-crystal or multi-crystalline silicon electrode.

Suitable insulating films include one or more components selected from: aluminum oxide, titanium oxide, silicon nitride, $SiN_x$:H, silicon oxide, silicon carbon oxynitride, a silicon nitride film containing carbon, a silicon oxide film containing carbon, and silicon oxide/titanium oxide. In one embodiment of the invention, the insulating film is an anti-reflection coating (ARC). The insulating film can be applied to a semiconductor substrate, or it can be naturally forming, such as in the case of silicon oxide.

In embodiment, the insulating film includes a layer of silicon nitride. The silicon nitride can be deposited by CVD (chemical vapor deposition), PECVD (plasma-enhanced chemical vapor deposition), sputtering, or other methods.

In one embodiment, the silicon nitride of the insulating layer is treated to remove at least a portion of the silicon nitride. The treatment can be a chemical treatment. The removal of at least a portion of the silicon nitride may result in an improved electrical contact between the conductor of the thick-film paste composition and the semiconductor substrate. This may result in improved efficiency of the semiconductor device.

In one embodiment, the silicon nitride of the insulating film is part of an anti-reflective coating.

The thick-film paste composition can be printed on the insulating film in a pattern, e.g., bus bars with connecting lines. The printing can be by screen printing, plating, extrusion, inkjet, shaped or multiple printing, or ribbons.

In this electrode-forming process, the thick-film paste composition is heated to remove the organic medium and sinter the metal powder. The heating can be carried out in air or an oxygen-containing atmosphere. This step is commonly referred to as "firing." The firing temperature profile is typically set so as to enable the burnout of organic binder materials from dried thick-film paste composition, as well as any other organic materials present. In one embodiment, the firing temperature is 750 to 950 CC. The firing can be conducted in a belt furnace using high transport rates, for example, 100-500 cm/min, with resulting hold-up times of 0.05 to 5 minutes. Multiple temperature zones, for example 3-11 zones, can be used to control the desired thermal profile.

Upon firing, the electrically conductive metal and Pb—Te—O mixture penetrate the insulating film. The penetration of the insulating film results in an electrical contact between the electrode and the semiconductor substrate. After firing, an interlayer may be formed between the semiconductor substrate and the electrode, wherein the interlayer includes one or more of tellurium, tellurium compounds, lead, lead compounds, and silicon compounds, where the silicon may originate comes from the silicon substrate and/or the insulating layer(s). After firing, the electrode includes sintered metal that contacts the underlying semiconductor substrate and may also contact one or more insulating layers.

Another aspect of the present invention is an article formed by a process comprising:
(a) providing a semiconductor substrate comprising one or more insulating films deposited onto at least one surface of the semiconductor substrate;
(b) applying a thick-film paste composition onto at least a portion of the one or more insulating films to form a layered structure,
wherein the thick-film paste composition includes:
  i) 85 to 99.5% by weight of electrically conductive metal or derivative thereof; based on total solids in the composition;
  ii) 0.5 to 15% by weight based on solids of a lead-tellurium-oxide, wherein the mole ratio of lead to tellurium of the lead-tellurium-oxide is between 5/95 and 95/5; and
  iii) an organic medium, and
(c) firing the semiconductor substrate, one or more insulating films, and thick-film paste, forming an electrode in contact with the one or more insulating layers and in electrical contact with the semiconductor substrate.

Such articles may be useful in the manufacture of photovoltaic devices. In one embodiment, the article is a semiconductor device comprising an electrode formed from the thick-film paste composition. In one embodiment, the electrode is a front-side electrode on a silicon solar cell. In one embodiment, the article further includes a back electrode.

EXAMPLES

Illustrative preparations and evaluations of hick-film paste compositions are described below.

Example I

Lead-Tellurium-Oxide Preparation

Lead-Tellurium-Oxide Preparation of Glass Frits of Tables 1 & 2

Mixtures of TeO$_2$ powder (99+% purity) and PbO powder (ACS reagent grade, 99+% purity) and optionally, PbF2, SiO2, B2O3, P2O5, lead phosphate, SnO2, SnO, Li2O, Li2(CO3), Li(NO3), V2O5, Ag2O, Ag2(CO3), Ag(NO3) were tumbled in a polyethylene container for 30 min to mix the starting powders. The starting powder mixture was placed in a platinum crucible and heated in air at a heating rate of 10° C./min to 900° C. and then held at 900° C. for one hour to melt the mixture. The melt was quenched from 900° C. by removing the platinum crucible from the furnace and pouring the melt onto a stainless steel platen. The resulting material was ground in a mortar and pestle to less than 100 mesh. The ground material was then ball-milled in a polyethylene container with zirconia balls and isopropyl alcohol until the $D_{50}$ was 0.5-0.7 microns. The ball-milled material was then separated from the milling balls, dried, and run through a 100 mesh screen to provide the flux powders used in the thick film paste preparations.

TABLE 1

Illustrative examples of powder mixtures that can be used to make suitable lead-tellurium oxides.

| Powder mixture | Wt % PbO | Wt % TeO$_2$ | Wt % PbF$_2$ | Wt % SiO$_2$ | Wt % B$_2$O$_3$ | Wt % P$_2$O$_5$ | Wt % SnO$_2$ | Wt % Li$_2$O | Wt % V$_2$O$_5$ | Wt % Ag$_2$O |
|---|---|---|---|---|---|---|---|---|---|---|
| A | 32.95 | 67.05 | | | | | | | | |
| B | 38.23 | 51.26 | 10.50 | | | | | | | |
| C | 67.72 | 32.28 | | | | | | | | |
| D | 72.20 | 27.80 | | | | | | | | |
| E | 80.75 | 19.25 | | | | | | | | |
| F | 59.69 | 9.30 | 16.19 | 14.82 | | | | | | |
| G | 75.86 | 9.26 | | 14.88 | | | | | | |
| H | 48.06 | 51.55 | | | 0.39 | | | | | |
| I | 48.16 | 51.65 | | | | 0.19 | | | | |
| J | 47.44 | 50.88 | | | 1.68 | | | | | |
| K | 47.85 | 51.33 | | | 0.82 | | | | | |
| L | 41.76 | 44.80 | | | 0.32 | | 0.80 | | | 12.32 |
| M | 46.71 | 50.10 | | | | | | | | 3.19 |
| N | 46.41 | 49.78 | | | | | | | | 3.80 |
| O | 45.11 | 48.39 | | | | | | | | 6.50 |
| P | 44.53 | 47.76 | | | | | | | | 7.71 |
| Q | 48.05 | 51.54 | | | | | 0.41 | | | |
| R | 47.85 | 51.33 | | | | | 0.82 | | | |
| S | 47.26 | 50.70 | | | | | 2.04 | | | |
| T | 45.82 | 49.19 | | | | | | | 4.99 | |
| U | 48.04 | 51.53 | | | | | | | 0.42 | |
| V | 39.53 | 28.26 | | | | | | | 32.21 | |

TABLE 2

Glass frit compositions in weight percent

| Glass # | TeO2/PbO (mole ratio) | PbO | TeO2 | PbF2 | SiO2 | Bi2O3 | BiF3 | SnO2 | Ag2O | SrO | Al2O3 | MgO | Na2O | In2O3 | BaO | WO3 | NiO |
|---|---|---|---|---|---|---|---|---|---|---|---|---|---|---|---|---|---|
| 1 | 0.17 | 80.21 | 9.79 | | 10.00 | | | | | | | | | | | | |
| 2 | 0.22 | 63.09 | 9.80 | 17.12 | 10.00 | | | | | | | | | | | | |
| 3 | 0.69 | 56.50 | 27.96 | | | 15.54 | | | | | | | | | | | |
| 4 | 0.69 | 50.84 | 25.17 | | 10.01 | 13.98 | | | | | | | | | | | |
| 5 | 0.69 | 53.51 | 26.50 | | 5.27 | 14.72 | | | | | | | | | | | |
| 6 | 1.36 | 48.56 | 47.12 | | | | | | | | | | | | 4.32 | | |
| 7 | 0.81 | 49.80 | 28.76 | | | | | | | | | | | | 21.44 | | |
| 8 | 1.15 | 45.70 | 37.49 | | | | 16.81 | | | | | | | | | | |
| 9 | 1.11 | 53.13 | 42.12 | | | | | | | | 4.75 | | | | | | |
| 10 | 1.50 | 47.11 | 50.52 | | | | | | | | | | 2.37 | | | | |
| 11 | 1.54 | 42.92 | 47.30 | | | | | | | | | | | | 8.76 | 1.02 | |
| 12 | 1.58 | 44.29 | 49.99 | | | | | 5.72 | | | | | | | | | |
| 13 | 1.86 | 42.56 | 56.54 | | | | | | | | | | | 0.89 | | | |
| 14 | 1.86 | 42.15 | 55.99 | | | | | | | | | | | 1.86 | | | |
| 15 | 1.50 | 47.37 | 50.81 | | | | | | | 1.83 | | | | | | | |
| 16 | 1.86 | 42.96 | 57.04 | | | | | | | | | | | | | | |
| 17 | 1.22 | 53.36 | 46.64 | | | | | | | | | | | | | | |
| 18 | 1.00 | 50.64 | 36.21 | | | | | | 13.15 | | | | | | | | |
| 19 | 1.00 | 52.68 | 37.67 | | | | | | 9.65 | | | | | | | | |

TABLE 2-continued

Glass frit compositions in weight percent

| Glass # | TeO2/PbO (mole ratio) | PbO | TeO2 | PbF2 | SiO2 | Bi2O3 | BiF3 | SnO2 | Ag2O | SrO | Al2O3 | MgO | Na2O | In2O3 | BaO | WO3 | NiO |
|---|---|---|---|---|---|---|---|---|---|---|---|---|---|---|---|---|---|
| 20 | 1.50 | 32.87 | 51.00 | 16.13 | | | | | | | | | | | | | |
| 21 | 0.82 | 63.09 | 36.91 | | | | | | | | | | | | | | |
| 22 | 0.67 | 67.72 | 32.28 | | | | | | | | | | | | | | |
| 23 | 0.54 | 72.20 | 27.80 | | | | | | | | | | | | | | |
| 24 | 1.50 | 47.24 | 50.68 | | | | | | | | | | | | | | 2.08 |
| 25 | 1.50 | 44.24 | 47.47 | | | | | 8.29 | | | | | | | | | |
| 26 | 1.00 | 53.62 | 38.34 | | | | | 8.05 | | | | | | | | | |

Note:
the compositions in the table are displayed in weight percent, based on the weight of the total glass composition. The TeO$_2$/PbO ratios is a molar ratio between only TeO$_2$ and PbO of the composition.

Lead-Tellurium-Oxide Preparation of Glass Frits of Tables 3

The lead-tellurium-lithium-oxide (Pb—Te—Li—Ti—O) compositions of Table 3 were prepared by mixing and blending Pb$_3$O$_4$ and TeO$_2$ powders, and optionally, as shown in Table 3, Pb$_2$P$_2$O$_7$, Ag$_2$O, Ag(NO$_3$) and/or SnO$_2$. The blended powder batch materials were loaded to a platinum alloy crucible then inserted into a furnace at 900-1000° C. using an air or O$_2$ containing atmosphere. The duration of the heat treatment was 20 minutes following the attainment of a full solution of the constituents. The resulting low viscosity liquid resulting from the fusion of the constituents was then quenched by metal roller. The quenched glass was then milled, and screened to provide a powder with a D$_{50}$ of 0.1 to 3.0 microns.

TABLE 3

Frit compositions in weight percent

| Glass # | SiO2 | PbO | P2O5 | Ag2O | SnO2 | TeO2 |
|---|---|---|---|---|---|---|
| 27 | | 44.53 | | 7.71 | | 47.76 |
| 28 | | | | 59.22 | | 40.78 |
| 29 | | 41.72 | | 13.54 | | 44.75 |
| 30 | | 80.75 | | | | 19.25 |
| 31 | 1.66 | 41.85 | 0.86 | 9.58 | 1.16 | 44.89 |
| 32 | | 58.31 | | | | 41.69 |
| 33 | 5.95 | 54.27 | | 5.41 | 1.23 | 33.14 |

Note:
the compositions in the table are displayed in weight percent, based on the weight of the total glass composition.

Example II

Paste Preparation

Thick Film Paste Preparation of Tables 5, 6, 7, & 8

The organic components of the thick-film paste and the relative amounts are given in Table 4.

TABLE 4

Organic components of the thick-film paste

| Component | Wt. % |
|---|---|
| 2,2,4-trimethyl-1,3-pentanediol monoisobutyrate | 5.57 |
| Ethyl Cellulose (50-52% ethoxyl) | 0.14 |
| Ethyl Cellulose (48-50% ethoxyl) | 0.04 |
| N-tallow-1,3-diaminopropane dioleate | 1.00 |
| Hydrogenated castor oil | 0.50 |
| Pentaerythritol tetraester of perhydroabietic acid | 1.25 |
| Dimethyl adipate | 3.15 |
| Dimethyl glutarate | 0.35 |

The organic components were put into Thinky mixing jar (Thinky USA, Inc) and Thinky-mixed at 2000 RPM for 2 to 4 min until well-blended. The inorganic components (Pb—Te—O powders and silver conductive powders) were tumble-mixed in a glass jar for 15 min. The total weight of the inorganic components was 88 g, of which 85-87 g was silver powder and 1-3 g was the mixture of PbO and TeO$_2$ powders. One third of inorganic components were then added to the Thinky jar containing the organic components and mixed for 1 min at 2000 RPM. This was repeated until all of the inorganic components were added and mixed. The paste was cooled and the viscosity was adjusted to between 200 and 500 Pa's by adding solvent and then mixing for 1 min at 200 RPM. This step was repeated until the desired viscosity was achieved. The paste was then roll-milled at a 1 mil gap for 3 passes at zero psi and 3 passes at 75 psi. The degree of dispersion was measured by fineness of grind (FOG). The FOG value is typically equal to or less than 20/10 for thick-film pastes. The viscosity of each paste was measured on a Brookfield viscometer with a #14 spindle and a #6 cup. The viscosity of the paste was adjusted after 24 hrs at RT to between 200 and 320 Pa·s. Viscosity was measured after 3 min at 10 RPM in a viscometer.

TABLE 5

Composition of thick-film pastes

| Example Number | Mol % TeO2 in Pb—Te—O Additive | Wt % Additive in Paste | Wt % Conductive Metal | Wt % Organic Vehicles |
|---|---|---|---|---|
| 1 | 60 | 1.0 | 87.0 | 12.0 |
| 2 | 60 | 1.0 | 87.0 | 12.0 |
| 3 | 60 | 2.0 | 86.0 | 12.0 |
| 4 | 60 | 2.0 | 86.0 | 12.0 |
| 5 | 60 | 3.0 | 85.0 | 12.0 |
| 6 | 60 | 3.0 | 85.0 | 12.0 |
| 7 | 50 | 1.0 | 87.0 | 12.0 |
| 8 | 50 | 1.0 | 87.0 | 12.0 |
| 9 | 50 | 2.0 | 86.0 | 12.0 |
| 10 | 50 | 2.0 | 86.0 | 12.0 |
| 11 | 50 | 3.0 | 85.0 | 12.0 |
| 12 | 50 | 3.0 | 85.0 | 12.0 |

Thick Film Paste Preparation of Tables 9, 10, 12, & 13

Paste preparations, in general, were prepared using the following procedure: The appropriate amount of solvent, medium and surfactant from Tables 9, 10, 12, & 13 were weighed and mixed in a mixing can for 15 minutes.

Since Ag is the major part of the solids, it was added incrementally to ensure better wetting. When well mixed, the paste was repeatedly passed through a 3-roll mill at progressively increasing pressures from 0 to 250 psi. The gap of the rolls was set to 2 mils. The paste viscosity was measured using a Brookfield viscometer and appropriate amounts of solvent and resin were added to adjust the paste viscosity toward a target of between 230 and 280 Pa-sec. The degree of dispersion was measured by fineness of grind (FOG). A typical FOG value for a paste is less than 20 microns for the fourth longest, continuous scratch and less than 10 microns for the point at which 50% of the paste is scratched.

To make the final pastes used to generate the data in Tables 9, 10, 12 & 13, 2 to 3 wt % of a frit from Table 1 was mixed into a portion of the Ag paste and dispersed by shear between rotating glass plates known to one skilled in the art as a muller. To make the final pastes of Tables 12 & 13 three separate pastes were made by 1) an appropriate amounts of Ag was added to an appropriate amount of the vehicle of Table 4 were rolled milled, 2) an appropriate amount of the $1^{st}$ glass frit from Table 3 was added to appropriate amount of the vehicle of Table 4 were roll milled, and 3) an appropriate amount of the $2^{nd}$ glass frit from Table 3 was added to the appropriate amount of vehicle of Table 4 was roll milled. Appropriate amounts of the Ag paste and the frit pastes were mixed together using a planetary centrifugal mixer (Thinky Corporation, Tokyo, Japan).

Table 11 shows the combined frit composition of the examples of Table 12 and 13. The combined frit compositions shown in Table 11 are calculated using the frit compositions of Table 3 in the blending ratio of Tables 12 & 13.

The paste examples of Table 5, 7, 8, 9, 12, and 13 were made using the procedure described above for making the paste compositions listed in the table according to the following details. Tested pastes contained 85 to 88% silver powder. These examples used a singular spherical silver with a $D_{50}$=2.0 µm.

Example III

Solar Cell Preparation

Solar Cell Preparation of the Examples in Tables 6, 7, & 8

Solar cells for testing the performance of the thick-film paste were made from 175 micron thick Q.Cell multi-crystalline silicon wafers with a 65 ohm/sq phosphorous-doped emitter layer which had an acid-etched textured surface and 70 nm thick PECVD $SiN_x$ antireflective coating. The solar cells were supplied by Q-Cells SE, OT Thalheim, Germany. The wafers were cut into 28 mm×28 mm wafers using a diamond wafering saw. Wafers were screen-printed after cut-down using an AMI-Presco MSP-485 screen printer to provide a bus-bar, eleven conductor lines at a 0.254 cm pitch, and a full ground-plane, screen-printed aluminum back-side conductor. After printing and drying, cells were fired in a BTU International rapid thermal processing belt furnace. The firing temperatures shown in Table 3 were the furnace set-point temperatures, which were approximately 125° C. greater than the actual wafer temperature. The fired conductor line median line width was 120 microns and mean line height was 15 microns. The median line resistivity was 3.0E-6 ohm·cm. Performance of the 28 mm×28 mm cells is expected to be impacted by edge effects that reduce the overall solar cell fill factor (FF) by ~5%.

Solar Cell Preparation of the Examples in Tables 9, 10, 12, & 13

Pastes were applied to 1.1"×1.1" dicing-saw-cut multi-crystalline silicon solar cells with a phosphorous-doped emitter on a p-type base. The paste from example #1 was applied to a DeutscheCell (DeutscheCell, Germany) multi-crystalline wafer with a 62Ω/□ emitter and pastes from examples #2 through #6 were applied to a Gintech (Gintech Energy Corporation, Taiwan) multi-crystalline wafer with a 55Ω/□ emitter. The solar cells used were textured by isotropic acid etching and had an anti-reflection coating (ARC) of $SiN_x$:H. Efficiency and fill factor, as shown in Tables 9, 10, 12, & 13, were measured for each sample. For each paste, the mean and median values of the efficiency and fill factor for 5 to 12 samples are shown. Each sample was made by screen-printing using a ETP model L555 printer set with a squeegee speed of 250 mm/sec. The screen used had a pattern of 11 finger lines with a 100 µm opening and 1 bus bar with a 1.5 mm opening on a 20 µm emulsion in a screen with 325 mesh and 23 µm wires. A commercially available Al paste, DuPont PV381, was printed on the non-illuminated (back) side of the device.

The device with the printed patterns on both sides was then dried for 10 minutes in a drying oven with a 250° C. peak temperature. The substrates were then fired sun-side up with a CF7214 Despatch 6 zone IR furnace using a 560 cm/min belt speed and 550-600-650-700-800-905 to 945° C. temperature set points. The actual temperature of the part was measured during processing. The estimated peak temperature of each part was 740-780° C. and each part was above 650° C. for a total time of 4 seconds. The fully processed samples were then tested for PV performance using a calibrated ST-1000 tester.

Examples IV

Solar Cell Performance: Efficiency and Fill Factor

Test Procedure: Efficiency and Fill Factor for the Examples of Tables 6, 7, & 8

Solar cell performance was measured using a ST-1000, Telecom STV Co. IV tester at 25° C.+/−1.0° C. The Xe Arc lamp hi the IV tester simulated sunlight with a known intensity, and irradiated the front surface of the cell. The tester used a four-contact method to measure current (I) and voltage (V) at approximately 400 load resistance settings to determine the cell's I-V curve. Solar cell efficiency (Eff), fill factor (FF), and series resistance (Rs) were calculated from the I-V curve. Rs is especially affected by contact resistivity (ρc), conductor line resistance and emitter sheet resistance. Since conductor line resistances and sheet resistances were nominally equivalent for the various samples, the differences in Rs were primarily due to ρc. Ideality factor was determined using the Suns-VOC technique. The ideality factor is reported at 0.1 sun irradiance.

Median values for efficiency, fill factor, series resistance, and ideality factors for solar cells prepared using the thick-film pastes of Examples 1-12 were determined and are summarized in Table 6. The mean and median values for efficiency for solar cells prepared using the think-film paste of examples 13-27 were determined and are summarized in Table 7. The mean and median values for fill factor for solar cells prepared using the think-film paste of examples 13-27 were determined and are summarized in Table 8.

TABLE 6

Performance of Pastes

| Ex. | Mol % TeO$_2$ in Pb—Te—O Additive | Peak Firing Temperature (° C.) | Median Efficiency (%) | Median Fill Factor (%) | Median Series Resistance (ohm cm$^2$) | Median Ideality Factor |
|---|---|---|---|---|---|---|
| 1 | 60 | 930 | 14.86 | 76.2 | 1.50 | 1.70 |
| 2 | 60 | 940 | 15.07 | 76.9 | 1.40 | 1.50 |
| 3 | 60 | 930 | 15.08 | 77.2 | 1.42 | 1.10 |
| 4 | 60 | 940 | 15.27 | 77.6 | 1.37 | 1.60 |
| 5 | 60 | 930 | 14.87 | 77.5 | 1.39 | 1.40 |
| 6 | 60 | 940 | 14.92 | 77.7 | 1.38 | 1.10 |
| 7 | 60 | 930 | 15.32 | 77.1 | 1.40 | 1.70 |
| 8 | 50 | 940 | 15.03 | 76.4 | 1.44 | 1.80 |
| 9 | 50 | 930 | 14.45 | 74.4 | 1.58 | 2.20 |
| 10 | 50 | 940 | 14.6 | 74 | 1.44 | 2.30 |
| 11 | 50 | 930 | 14.29 | 73.6 | 1.54 | 2.40 |
| 12 | 50 | 940 | 14.26 | 73.7 | 1.48 | 2.10 |

TABLE 7

Mean and median efficiency (Eff %) of Pastes

| Example Number | Glass # | Glass amount (wt %) | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median |
|---|---|---|---|---|---|---|---|---|---|---|---|---|---|---|---|---|---|---|
| 13 | 1 | 4.5 | | | 14.90 | 14.89 | | | 15.00 | 14.92 | 15.03 | 15.01 | 14.34 | 14.16 | | | 13.43 | 13.44 |
| 14 | 2 | 4.5 | | | 14.13 | 14.27 | | | 14.85 | 14.79 | 14.95 | 14.98 | 14.92 | 14.94 | | | 15.01 | 15.08 |
| 15 | 3 | 2.5 | | | | | | | 14.13 | 14.12 | 14.32 | 14.23 | 13.86 | 13.96 | | | 14.19 | 14.12 |
| 16 | 6 | 2.1 | | | | | | | 13.84 | 13.96 | 14.24 | 14.35 | 14.30 | 14.37 | | | 13.77 | 14.19 |
| 17 | 8 | 1.5 | | | | | | | 15.27 | 15.35 | 15.34 | 15.28 | 15.50 | 15.49 | | | 15.33 | 15.34 |
| 18 | 10 | 3 | | | 13.15 | 12.87 | | | 13.56 | 13.57 | 13.70 | 13.59 | 12.66 | 12.93 | | | 11.70 | 11.88 |
| 19 | 13 | 2 | | | 12.06 | 12.45 | | | 11.50 | 12.03 | 12.54 | 12.53 | 13.10 | 13.09 | | | 13.72 | 13.65 |
| 20 | 25 | 2 | | | 8.27 | 7.94 | | | 11.95 | 12.29 | 13.16 | 13.17 | 13.52 | 14.39 | | | 13.52 | 14.39 |
| 21 | A | 2 | 14.14 | 14.34 | | | 14.50 | 14.71 | | | 15.50 | 15.00 | | | | | | |
| 22 | C | 1 | 13.57 | 14.03 | | | 17.71 | 14.92 | | | 14.92 | 14.83 | | | 14.86 | 14.86 | | |
| 23 | D | 1 | 13.64 | 13.92 | | | 14.72 | 14.81 | | | 14.93 | 14.98 | | | 14.81 | 14.84 | | |
| 24 | B | 2 | 14.34 | 14.38 | 14.60 | 14.52 | | | 15.06 | 145.08 | 15.00 | 15.19 | 15.37 | 15.42 | | | | |
| 25 | K | 2 | | | 13.58 | 13.24 | | | 12.35 | 14.59 | 14.95 | 14.95 | 15.14 | 15.21 | | | | |
| 26 | J | 2 | | | 13.16 | 14.04 | | | 13.34 | 15.03 | 11.61 | 15.29 | 15.34 | 15.41 | | | | |
| 27 | M | 2 | 14.95 | 14.92 | 15.06 | 15.14 | | | 15.20 | 15.17 | 15.35 | 15.27 | 15.19 | 15.22 | | | | |
| 28 | O | 2 | 14.37 | 14.55 | 14.73 | 14.95 | | | 15.17 | 15.27 | 15.55 | 15.33 | 15.06 | 15.27 | | | | |
| 29 | 15 | 2 | | | | | | | | | 12.00 | 12.30 | 13.78 | 13.90 | 14.38 | 14.95 | 14.55 | 14.48 |
| 30 | 16 | 2 | | | 12.51 | 13.33 | | | 14.41 | 14.43 | 14.47 | 14.51 | 14.57 | 14.55 | 14.93 | 14.94 | | |
| 31 | 17 | 2 | | | 13.41 | 13.77 | | | 14.36 | 14.47 | 14.97 | 14.97 | 14.81 | 14.89 | 15.18 | 15.13 | | |
| 32 | 18 | 2 | | | | | | | | | 14.91 | 14.80 | 15.17 | 15.13 | 15.23 | 15.33 | 15.26 | 15.20 |
| 33 | 19 | 2 | | | | | | | | | 14.88 | 14.91 | 14.73 | 14.73 | 14.69 | 14.70 | 15.11 | 15.02 |
| 34 | 21 | 2 | | | | | | | 14.11 | 14.03 | 13.72 | 13.68 | 14.17 | 14.16 | 14.18 | 13.94 | 14.27 | 14.80 |
| 35 | 22 | 2 | | | | | | | 14.50 | 14.45 | 14.73 | 14.79 | 14.54 | 14.64 | 14.94 | 14.86 | 14.60 | 14.66 |
| 36 | 23 | 2 | | | | | | | 13.22 | 13.19 | 12.88 | 12.80 | 11.81 | 11.75 | 11.38 | 11.40 | 11.82 | 11.83 |
| 37 | 20 | 2 | | | | | | | 14.90 | 14.94 | 15.29 | 15.25 | 14.85 | 14.83 | 15.43 | 15.46 | 15.29 | 15.20 |

Additional columns for Example 32: 15.03 14.93
Additional columns for Example 33: 14.94 14.96
Additional columns for Example 29: 14.43 14.55

TABLE 8

Mean and median fill factor (FF) of Pastes

| Example Number | Glass # | Glass amount (wt %) | 900 C. FF mean | 900 C. FF median | 910 C. FF mean | 910 C. FF median | 915 C. FF mean | 915 C. FF median | 920 C. FF mean | 920 C. FF median | 930 C. FF mean | 930 C. FF median |
|---|---|---|---|---|---|---|---|---|---|---|---|---|
| 13 | 1 | 4.5 | | | 76.84 | 77.60 | | | 76.82 | 76.80 | 76.82 | 77.30 |
| 14 | 2 | 4.5 | | | 72.58 | 73.30 | | | 75.74 | 76.10 | 75.80 | 75.90 |
| 15 | 3 | 2.5 | | | | | | | 74.42 | 74.70 | 74.88 | 74.80 |
| 16 | 6 | 2.1 | | | | | | | 71.84 | 72.80 | 73.44 | 73.90 |
| 17 | 8 | 1.5 | | | | | | | 78.32 | 78.30 | 78.86 | 78.90 |
| 18 | 10 | 3 | | | 68.46 | 68.40 | | | 71.56 | 73.30 | 71.24 | 71.30 |
| 19 | 13 | 2 | | | 62.82 | 64.10 | | | 60.44 | 61.30 | 64.88 | 65.60 |
| 20 | 25 | 2 | | | 44.24 | 43.20 | | | 60.64 | 62.00 | 66.90 | 67.10 |
| 21 | A | 2 | 71.96 | 71.90 | | | 72.84 | 73.60 | | | 75.96 | 76.00 |
| 22 | C | 1 | 70.26 | 72.10 | | | 75.86 | 76.40 | | | 76.48 | 76.80 |
| 23 | D | 1 | 72.30 | 73.20 | | | 75.26 | 75.10 | | | 76.24 | 76.70 |
| 24 | B | 2 | | | | | | | | | | |
| 25 | K | 2 | | | 69.30 | 69.50 | | | 63.86 | 74.50 | 75.76 | 76.10 |
| 26 | J | 2 | | | 67.70 | 72.20 | | | 66.90 | 74.60 | 59.58 | 75.70 |
| 27 | M | 2 | 76.30 | 76.10 | 76.78 | 77.10 | | | 78.02 | 77.90 | 77.84 | 78.10 |
| 28 | O | 2 | 76.26 | 76.40 | 77.30 | 77.80 | | | 78.06 | 77.90 | 78.04 | 78.10 |
| 29 | 15 | 2 | | | | | | | | | 65.54 | 63.00 |
| 30 | 16 | 2 | | | 64.50 | 69.20 | | | 74.46 | 74.90 | 75.50 | 75.40 |
| 31 | 17 | 2 | | | 70.23 | 70.85 | | | 74.56 | 75.20 | 75.62 | 75.60 |
| 32 | 18 | 2 | | | | | | | | | 75.86 | 76.00 |
| 33 | 19 | 2 | | | | | | | | | 75.66 | 75.20 |
| 34 | 21 | 2 | | | | | | | 75.82 | 76.10 | 74.90 | 76.40 |
| 35 | 22 | 2 | | | | | | | 75.06 | 75.30 | 76.03 | 76.05 |
| 36 | 23 | 2 | | | | | | | 70.56 | 71.20 | 65.85 | 65.55 |
| 37 | 20 | 2 | | | | | | | 77.54 | 77.40 | 78.34 | 78.20 |

| Example Number | 940 C. FF mean | 940 C. FF median | 945 C. FF mean | 945 C. FF median | 950 C. FF mean | 950 C. FF median | 960 C. FF mean | 960 C. FF median | 970 C. FF mean | 970 C. FF median |
|---|---|---|---|---|---|---|---|---|---|---|
| 13 | 72.66 | 72.50 | | | 69.12 | 69.10 | | | | |
| 14 | 76.52 | 76.30 | | | 77.04 | 77.20 | | | | |
| 15 | 72.78 | 73.10 | | | 73.34 | 73.30 | | | | |
| 16 | 73.54 | 73.10 | | | 71.54 | 73.60 | | | | |
| 17 | 79.10 | 79.00 | | | 78.86 | 78.90 | | | | |
| 18 | 65.96 | 66.50 | | | 60.62 | 60.00 | | | | |
| 19 | 67.68 | 68.70 | | | 71.42 | 69.10 | | | | |
| 20 | 69.36 | 73.10 | | | 69.36 | 68.10 | | | | |
| 21 | | | | | | | | | | |
| 22 | | | 76.94 | 77.10 | | | | | | |
| 23 | | | 75.70 | 76.10 | | | | | | |
| 24 | | | | | | | | | | |
| 25 | 76.82 | 76.70 | | | | | | | | |
| 26 | 76.80 | 76.70 | | | | | | | | |
| 27 | 77.52 | 77.90 | | | | | | | | |
| 28 | 77.92 | 77.80 | | | | | | | | |
| 29 | 69.18 | 69.80 | | | 72.88 | 74.60 | 74.20 | 74.50 | 73.43 | 73.45 |
| 30 | 74.20 | 74.20 | | | 76.70 | 77.30 | | | | |
| 31 | 75.82 | 75.60 | | | 76.82 | 77.70 | | | | |
| 32 | 76.66 | 77.10 | | | 76.64 | 77.50 | 77.50 | 77.75 | 77.10 | 77.45 |
| 33 | 75.82 | 75.80 | | | 76.70 | 76.60 | 76.65 | 76.50 | 76.50 | 76.60 |
| 34 | 76.90 | 76.85 | | | 77.10 | 77.40 | 76.50 | 76.40 | | |
| 35 | 75.85 | 76.10 | | | 75.70 | 75.90 | 75.34 | 76.30 | | |
| 36 | 63.78 | 63.45 | | | 60.58 | 60.00 | 61.80 | 62.30 | | |
| 37 | 78.26 | 78.20 | | | 78.90 | 79.10 | 78.58 | 78.80 | | |

Test Procedure: Efficiency and Fill Factor for the Examples of Tables 9, 10, 12, & 13

The solar cells built according to the method described herein were tested for conversion efficiency. An exemplary method of testing efficiency is provided below.

In an embodiment, the solar cells built according to the method described herein were placed in a commercial 1-V tester for measuring efficiencies (Telecom STV, model ST-1000). The Xe Arc lamp in the 1-V tester simulated the sunlight with a known intensity, AM 1.5, and irradiated the front surface of the cell. The tester used a multi-point contact method to measure current (I) and voltage (V) at approximately 400 load resistance settings to determine the cell's I-V curve. Both fill factor (FF) and efficiency (Eff) were calculated from the I-V curve.

TABLE 9

Paste efficiency (Eff %) data for the results of pastes using select frits of table 3

| Example # | Glass # | Frit level (wt %) | 905 C. Mean | 905 C. Median | 915 C. Mean | 915 C. Median | 920 C. Mean | 920 C. Median | 925 C. Mean | 925 C. Median | 940 C. Mean | 940 C. Median | 945 C. Mean | 945 C. Median |
|---|---|---|---|---|---|---|---|---|---|---|---|---|---|---|
| 38 | 29 | 2 | | | | | | | | | | | 14.65 | 14.66 |
| 39 | 30 | 3.35 | 13.08 | 13.07 | 13.05 | 13.33 | | | 12.91 | 12.84 | | | | |
| 40 | 31 | 3.45 | 13.56 | 13.55 | 13.31 | 13.45 | | | 14.10 | 13.99 | | | | |
| 41 | 33 | 2 | | | | | 13.18 | 13.14 | | | 12.33 | 12.41 | | |

TABLE 10

Paste fill factor (FF) data for the results of pastes using select frits of table 3

| Example # | Glass # | Frit level (wt %) | 905 C. Mean | 905 C. Median | 915 C. Mean | 915 C. Median | 920 C. Mean | 920 C. Median | 925 C. Mean | 925 C. Median | 940 C. Mean | 940 C. Median | 945 C. Mean | 945 C. Median |
|---|---|---|---|---|---|---|---|---|---|---|---|---|---|---|
| 38 | 29 | 2 | | | | | | | | | | | 70.99 | 70.83 |
| 39 | 30 | 3.35 | 69.79 | 69.04 | 70.51 | 71.40 | | | 68.84 | 68.61 | | | | |
| 40 | 31 | 3.45 | 72.03 | 72.30 | 71.01 | 71.38 | | | 74.20 | 74.75 | | | | |
| 41 | 33 | 2 | | | | | 66.33 | 65.55 | | | 62.84 | 62.35 | | |

TABLE 11

Combined frit composition resulting from the blended frit experiments of Tables 12 and 13 using the frits from Table 3.

| Blended Glass Composition Number | PbO | Ag2O | TeO2 |
|---|---|---|---|
| I | 33.40 | 20.58 | 46.02 |
| II | 37.70 | 20.92 | 41.37 |
| III | 29.15 | 29.61 | 41.24 |
| IV | 43.73 | 14.80 | 41.47 |

TABLE 12

The paste efficiency (Eff %) results of paste using a blend of two different frits from table 3 (combined frit compositions given in Table 11).

| Example # | 1st Glass # | 2nd Glass # | Blended Glass Composition Number | 1st frit level (wt %) | 2nd frit level (wt %) | total frit level (wt %) | 905 C. Mean | 905 C. Median | 915 C. Mean | 915 C. Median | 925 C. Mean | 925 C. Median |
|---|---|---|---|---|---|---|---|---|---|---|---|---|
| 42 | 27 | 28 | I | 1.5 | 0.5 | 2 | 15.31 | 15.37 | 14.92 | 15.13 | 15.10 | 15.16 |
| 43 | 32 | 28 | II | 1.93 | 1.07 | 3 | 14.69 | 14.76 | 14.65 | 14.69 | 14.80 | 14.83 |
| 44 | 32 | 28 | III | 1.5 | 1.5 | 3 | 14.77 | 14.83 | 15.19 | 15.32 | 15.03 | 15.15 |
| 45 | 32 | 28 | IV | 1.6 | 0.6 | 2.2 | 15.35 | 15.29 | 15.21 | 15.16 | 15.13 | 15.16 |

TABLE 13

The paste fill factor (FF) results of paste using a blend of two different frits from table 3 (combined frit compositions given in Table 11).

| Example # | 1st Glass # | 2nd Glass # | Blended Glass Composition Number | 1st frit level (wt %) | 2nd frit level (wt %) | total frit level (wt %) | Fill Factor (FF) | | | | | |
|---|---|---|---|---|---|---|---|---|---|---|---|---|
| | | | | | | | 905 C. | | 915 C. | | 925 C. | |
| | | | | | | | Mean | Median | Mean | Median | Mean | Median |
| 42 | 27 | 28 | I | 1.5 | 0.5 | 2 | 75.36 | 75.30 | 74.83 | 75.45 | 75.98 | 76.37 |
| 43 | 32 | 28 | II | 1.93 | 1.07 | 3 | 74.20 | 75.03 | 73.52 | 73.57 | 74.09 | 75.03 |
| 44 | 32 | 28 | III | 1.5 | 1.5 | 3 | 73.66 | 74.13 | 75.23 | 75.58 | 74.94 | 75.03 |
| 45 | 32 | 28 | IV | 1.6 | 0.6 | 2.2 | 76.23 | 76.60 | 76.37 | 76.17 | 76.59 | 76.63 |

Comparative Example I: Bismuth-Tellurium-Oxide

Preparation of Bismuth-Tellurium-Oxide

A bismuth-tellurium-oxide (Bi—Te—O) containing composition as shown in table 14 was prepared using boron oxide ($B_2O_3$), zinc oxide (ZnO), titanium oxide ($TiO_2$), bismuth oxide ($B_2O_3$), tellurium oxide ($TeO_2$), lithium carbonate ($LiCO_3$), and lithium phosphate ($LiPO_4$) and by the procedure described above in Example I: Lead-tellurium-oxide preparation of glass frits of Table 3.

TABLE 14

Bismuth-tellurium-oxide composition in weight percent of the oxides

| | Glass A (wt %) |
|---|---|
| $B_2O_3$ | 2.09 |
| ZnO | 0.98 |
| $TiO_2$ | 0.48 |
| $Bi_2O_3$ | 26.64 |
| $TeO_2$ | 67.22 |
| $P_2O_5$ | 0.43 |
| $Li_2O$ | 2.16 |

Note:
the composition in the table are displayed as weight percent, based on the weight of the total glass composition Paste Preparation Pastes using glass A were made by the following procedure. A paste was made by mixing the appropriate amount of organic vehicle (Table 4) and Ag powder. The Ag paste was passed through a 3-roll mill at progressively increasing pressures from 0 to 75 psi. The Ag paste viscosity was measured using a Brookfield viscometer and appropriate amounts of solvent and resin were added to adjust the paste viscosity toward a target of between 230 and 280 Pa-sec. Another paste was made by mixing the appropriate amount of organic vehicle (Table 4) and glass powder A. The frit paste was passed through a 3-roll mill at progressively increasing pressures from 0 to 250 psi. The degree of dispersion of each paste was measured by fineness of grind (FOG). A typical FOG value for a paste is less than 20 microns for the fourth longest, continuous scratch and less than 10 microns for the point at which 50% of the paste is scratched.

Ag and frit pastes were mixed with a mixed together using a planetary centrifugal mixer (Thinky Corporation, Tokyo, Japan) to make the final paste recipes displayed in table 15. Solar Cell Preparation and Efficiency and Fill Factor Measurement Pastes were applied to 1.1"×1.1" dicing-saw-cut multi-crystalline silicon solar cells with a phosphorous-doped emitter on a p-type base. The pastes were applied to a DeutscheCell (DeutscheCell, Germany) multi-crystalline wafer with a 62Ω/□ emitter. The solar cells used were textured by isotropic acid etching and had an anti-reflection coating (ARC) of $SiN_x$:H. Efficiency and fill factor, as shown in Table 15, were measured for each sample. Each sample was made by screen-printing using a ETP model L555 printer set with a squeegee speed of 200 mm/sec. The screen used had a pattern of 11 finger lines with a 100 μm opening and 1 bus bar with a 1.5 mm opening on a 20 μm emulsion in a screen with 325 mesh and 23 μm wires. A commercially available Al paste, DuPont PV381, was printed on the non-illuminated (back) side of the device.

The device with the printed patterns on both sides was then dried for 10 minutes in a drying oven with a 250° C. peak temperature. The substrates were then fired sun-side up with a $CF_{7214}$ Despatch 6 zone IR furnace using a 560 cm/min belt speed and 500-550-610-700-800-HZ6 temperature set points, where HZ6=885, 900 & 915° C. The actual temperature of the part was measured during processing. The estimated peak temperature of each part was 745-775° C. and each part was above 650° C. for a total time of 4 seconds. The fully processed samples were then tested for PV performance using a calibrated ST-1000 tester.

Efficiency and fill factor, shown in Table 15, were measured for each sample. For each paste, the mean and median values of the efficiency and fill factor for 6 samples are shown.

TABLE 15

Recipe and electrical performance for pastes containing the bismuth-tellurium-oxide glass A of Table 14

| Example # | Glass # | Ag wt % | Frit wt % | Efficiency (Eff %) | | | | | | Fill Factor (FF) | | | | | |
|---|---|---|---|---|---|---|---|---|---|---|---|---|---|---|---|
| | | | | 900 | | 915 | | 930 | | 900 | | 915 | | 930 | |
| | | | | Mean | Median | Mean | Median | Mean | Median | Mean | Median | Mean | Median | Mean | Median |
| A | A | 88.6 | 2.1 | 10.04 | 10.13 | 12.46 | 13.01 | 12.61 | 12.98 | 52.8 | 53.5 | 65.1 | 67.3 | 64.2 | 65.6 |
| A | A | 86.3 | 4.2 | 1.14 | 0.83 | 1.45 | 1.42 | 2.93 | 2.79 | 28.7 | 29.7 | 29.4 | 29.5 | 30.7 | 30.1 |

What is claimed is:

1. A thick-film paste composition for use in forming an electrical connection in a photovoltaic device comprising a semiconductor substrate having at least one insulating layer on a main surface thereof, the composition comprising:
   a) 96.55 to 99.5% by weight of an electrically conductive metal or derivative thereof, based on total solids in the composition;
   b) 0.5 to 3.45% by weight based on solids of a lead-tellurium-oxide, wherein the lead-tellurium-oxide comprises at least 35 mole % of $TeO_2$ and the weight ratio of elemental lead to elemental tellurium in the lead-tellurium-oxide is within the range of 0.87 to 9.51; and
   c) an organic medium;
   wherein the thick-film paste, when fired, is capable of penetrating the at least one insulating layer.

2. The thick-film paste of claim 1, wherein the electrically conductive metal comprises silver.

3. The thick-film paste of claim 1, wherein the organic medium comprises a polymer.

4. The thick-film paste of claim 3, wherein the organic medium further comprises one or more additives selected from the group consisting of solvents, stabilizers, surfactants, and thickeners.

5. The thick-film paste of claim 1, wherein the Pb—Te—O is at least partially crystalline.

6. The thick-film paste of claim 1, further comprising an additive selected from the group consisting of: $TiO_2$, $Li_2O$, $B_2O_3$, $PbF_2$, $SiO_2$, $Na_2O$, $K_2O$, $Rb_2O$, $Cs_2O$, $Al_2O_3$, MgO, CaO, SrO, BaO, $V_2O_5$, $ZrO_2$, $MoO_3$, $Mn_2O_3$, $Ag_2O$, ZnO, $Ga_2O_3$, $GeO_2$, $In_2O_3$, $SnO_2$, $Sb_2O_3$, $Bi_2O_3$, $BiF_3$, $P_2O_5$, CuO, NiO, $Cr_2O_3$, $Fe_2O_3$, CoO, $Co_2O_3$, and $CeO_2$.

7. The thick film paste of claim 1, wherein the lead-tellurium oxide further comprises one or more elements selected from the group consisting of: Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

8. A process comprising:
   (a) providing a semiconductor substrate comprising one or more insulating films deposited onto at least one surface of a semiconductor substrate;
   (b) applying a thick-film paste composition onto at least a portion of the insulating film to form a layered structure,
   wherein the thick-film paste composition comprises:
      i) 96.55% to 99.5% by weight of an electrically conductive metal or derivative thereof, based on total solids in the composition;
      ii) 0.5 to 3.45% by weight based on solids of a lead-tellurium-oxide, wherein the lead-tellurium-oxide comprises at least 35 mole % of $TeO_2$ and the weight ratio of elemental lead to elemental tellurium in the lead-tellurium-oxide is within the range of 0.87 to 9.51; and
      iii) an organic medium; and
   (c) firing the semiconductor substrate, one or more insulating films, and thick-film paste, forming an electrode in contact with the one or more insulating layers and in electrical contact with the semiconductor substrate.

9. The process of claim 8, wherein the thick-film paste composition is applied pattern-wise onto the insulating film.

10. The process of claim 8, wherein the firing is carried out in air or an oxygen-containing atmosphere.

11. An article comprising:
   a) a semiconductor substrate;
   b) one or more insulating layers on the semiconductor substrate; and
   c) an electrode in contact with the one or more insulating layers and in electrical contact with the semiconductor substrate, the electrode comprising 96.55 to 99.5% by weight based on solids of an electrically conductive metal and 0.5 to 3.45% by weight based on solids of lead-tellurium-oxide, wherein the lead-tellurium-oxide comprises at least 35 mole % of $TeO_2$ and the weight ratio of elemental lead to elemental tellurium in the lead-tellurium-oxide is within the range of 0.87 to 9.51.

12. The article of claim 11, wherein the article is a semiconductor device.

13. The article of claim 12, wherein the semiconductor device is a solar cell.

14. The thick film paste of claim 1, wherein the lead-tellurium-oxide comprises one or more glass frits.

15. The process of claim 8, wherein the lead-tellurium-oxide comprises one or more glass frits.

16. The thick film paste of claim 2, wherein the silver comprises at most 9.5% silver flakes by weight of the total solids.

* * * * *